(12) United States Patent
Li

(10) Patent No.: US 8,928,850 B2
(45) Date of Patent: Jan. 6, 2015

(54) LIQUID CRYSTAL DISPLAY PANEL BASED ON THREE-DIMENSIONAL TRANSISTOR AND LIQUID CRYSTAL DISPLAY DEVICE USING THE SAME

(71) Applicant: Shenzhen China Star Optoelectronics Technology Co., Ltd., Shenzhen, Guangdong (CN)

(72) Inventor: Quan Li, Guangdong (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 227 days.

(21) Appl. No.: 13/808,099

(22) PCT Filed: Dec. 14, 2012

(86) PCT No.: PCT/CN2012/086632
§ 371 (c)(1),
(2) Date: Jan. 3, 2013

(87) PCT Pub. No.: WO2014/086062
PCT Pub. Date: Jun. 12, 2014

(65) Prior Publication Data
US 2014/0152931 A1 Jun. 5, 2014

(30) Foreign Application Priority Data
Dec. 4, 2012 (CN) .......................... 2012 1 0512685

(51) Int. Cl.
*G02F 1/1345* (2006.01)
(Continued)

(52) U.S. Cl.
CPC ............ *G02F 1/1368* (2013.01); *H01L 29/786* (2013.01)
USPC ................. 349/152; 349/42; 349/44; 349/15; 345/80; 345/90

(58) Field of Classification Search
CPC ............ G02F 1/1345; G02F 1/136204; G02F 1/136209; G02F 1/133512; G02F 1/136227; G02F 2001/136254; G09G 2300/0842; G09G 3/3233; G09G 3/3648; G09G 2300/0819; G09G 3/3614; G09G 3/3659; G02B 27/2214; G02B 27/26; H04N 13/0404; H01L 27/12; H01L 27/1214
USPC ...................... 349/152, 42, 44, 15; 345/80, 90
See application file for complete search history.

(56) References Cited

U.S. PATENT DOCUMENTS

2009/0147204 A1* 6/2009 Kang ............................ 349/150
2010/0245299 A1* 9/2010 Han et al. ...................... 345/204

FOREIGN PATENT DOCUMENTS

| CN | 1595244 A | 3/2005 |
|---|---|---|
| CN | 202453585 U | 9/2012 |
| CN | 202565413 U | 11/2012 |

(Continued)

OTHER PUBLICATIONS

International Search Report of PCT Application No. PCT/CN2012/086632 Dec. 9, 2013.

*Primary Examiner* — Mike Qi

(57) ABSTRACT

A liquid crystal display device and a liquid crystal display panel based on three-dimensional transistor thereof are provided. The liquid crystal display panel includes an array substrate, a printed circuit board, a first chip on film with an integrated circuit, and At least one connector connected between the array substrate and the printed circuit board. The first chip on film is attached between the array substrate and the printed circuit board. The array substrate and the printed circuit board can be supported by the connectors effectively. The connectors share gravity of the printed circuit board with the first chip on film attached between the array substrate and the printed circuit board. Therefore, the present disclosure can avoid damage to lines of the first chip on film and improve the yield rate of the quality of the liquid crystal display panel based on three-dimensional transistor.

20 Claims, 2 Drawing Sheets

(51) Int. Cl.
- *G02F 1/136* (2006.01)
- *G02F 1/1335* (2006.01)
- *G09G 3/30* (2006.01)
- *G09G 3/36* (2006.01)
- *G02F 1/1368* (2006.01)
- *H01L 29/786* (2006.01)

(56) References Cited

FOREIGN PATENT DOCUMENTS

| KR | 20060099224 A | 9/2006 |
| WO | 2011/104965 A1 | 9/2011 |

\* cited by examiner

LIQUID CRYSTAL DISPLAY PANEL BASED ON THREE-DIMENSIONAL TRANSISTOR AND LIQUID CRYSTAL DISPLAY DEVICE USING THE SAME

BACKGROUND

1. Technical Field

The present disclosure relates to liquid crystal displaying technologies, and particularly to a liquid crystal display device and liquid crystal display panel based on three-dimensional transistor thereof.

2. Description of Related Art

At present, a liquid crystal display panel based on three-dimensional transistor refers to a liquid crystal display panel in which the number of gate circuits is increased and the number of source circuits is decreased correspondingly. A liquid crystal display panel based on three-dimensional transistor of the related art is shown in FIG. 1. The liquid crystal display panel based on three-dimensional transistor as shown in FIG. 1 includes an array substrate 10, a printed circuit board 20, and a COF (Chip on Film) 30 with an integrated circuit. The COF 30 is attached between the array substrate 10 and the printed circuit board 20. Since there is only one COF 30 attached between the array substrate 10 and the printed circuit board 20, and lines of the COF 30 are crowded and a width of each line only ranges from 20 um to 30 um, the lines of the COF 30 are easy to be damaged when the COF 30 is under gravity of the printed circuit board 20. Therefore, the yield rate of the quality of the liquid crystal display panel based on three-dimensional transistor is greatly decreased.

SUMMARY

The present disclosure provides a liquid crystal display panel based on three-dimensional transistor, which avoids damage to lines of the chip on film.

The liquid crystal display panel based on three-dimensional transistor includes an array substrate; a printed circuit board; a first chip on film with an integrated circuit attached between the array substrate and the printed circuit board; and at least one connector connected between the array substrate and the printed circuit board.

Preferably, the at least one connector is a sheet made of copper laminate, aluminum foil laminate or PET.

Preferably, the at least one connector is a second chip on film with a function circuit.

Preferably, each of the at least one connector is a conductive plate used to guide static electricity of the array substrate to the printed circuit board, and at least one copper leakage area is disposed on the printed circuit board and is respectively connected to the conductive plate.

Preferably, the at least one connector is bonded to the array substrate and the printed circuit board.

Preferably, the number of the connector is at least two, at least one of the connector is a second chip on film with a function circuit and at least one of the connector is a conductive plate used to guide static electricity of the array substrate to the printed circuit board, and at least one copper leakage area is disposed on the printed circuit board and is respectively connected to the conductive plate.

Preferably, the at least one connector includes a main body; a first side wall and a second side wall extend from one end of the main body, and a third side wall and a fourth side wall extend from the other end of the main body; a first enclosed cavity is enclosed by the first side wall and the second side wall, and the printed circuit board is fixed into the first enclosed cavity; a second enclosed cavity is enclosed by the third side wall and the fourth side wall, and the array substrate is fixed into the second enclosed cavity.

Preferably, the at least one connector includes a main body; a fifth side wall and a sixth side wall extend from one end of the main body, a third enclosed cavity is enclosed by the fifth side wall and the sixth side wall, the printed circuit board is fixed into the third enclosed cavity, and the other end of the main body is attached on the array substrate.

The present disclosure further provides another liquid crystal display panel based on three-dimensional transistor, including: an array substrate; a printed circuit board; a first chip on film with an integrated circuit, and at least one connector. The first chip on film is attached between the array substrate and the printed circuit board. The at least one connector is connected between the array substrate and the printed circuit board. The at least one connector is fixed through one assembling slot disposed on the printed circuit board and two free ends of the connector extending out of the assembling slot are attached on the array substrate.

Preferably, the at least one connector is a sheet made of copper laminate, aluminum foil laminate or PET, or the at least one connector is a second chip on film with a function circuit, or the at least one connector is a conductive plate used to guide static electricity of the array substrate to the printed circuit board, and at least one copper leakage area is disposed on the printed circuit board and is respectively connected to the conductive plate.

Preferably, the number of the connector is at least two, at least one of the connector is a second chip on film with a function circuit and at least one of the connector is a conductive plate used to guide static electricity of the array substrate to the printed circuit board, and at least one copper leakage area is disposed on the printed circuit board and is respectively connected to the conductive plate.

The present disclosure further yet provides a liquid crystal display device including a liquid crystal display panel based on three-dimensional transistor. The liquid crystal display panel includes an array substrate; a printed circuit board; a first chip on film has an integrated circuit and is attached between the array substrate and the printed circuit board; and at least one connector being connected between the array substrate and the printed circuit board.

Preferably, the at least one connector is a sheet made of copper laminate, aluminum foil laminate or PET.

Preferably, the at least one connector is a second chip on film with a function circuit.

Preferably, the at least one connector is a conductive plate used to guide static electricity of the array substrate to the printed circuit board, and at least one copper leakage area is disposed on the printed circuit board and is respectively connected to the conductive plate.

Preferably, the at least one connector is bonded to the array substrate and the printed circuit board.

Preferably, the number of the connector is at least two, at least one of the connector is a second chip on film with a function circuit and at least one of the connector is a conductive plate used to guide static electricity of the array substrate to the printed circuit board, and at least one copper leakage area is disposed on the printed circuit board and is respectively connected to the conductive plate.

Preferably, the at least one connector includes a main body; a first side wall and a second side wall extend from one end of the main body, and a third side wall and a fourth side wall extend from the other end of the main body; a first enclosed cavity is enclosed by the first side wall and the second side wall, and the printed circuit board is fixed into the first enclosed cavity; a second enclosed cavity is enclosed by the third side wall and the fourth side wall, and the array substrate is fixed into the second enclosed cavity.

Preferably, the at least one connector includes a main body; a fifth side wall and a sixth side wall extend from one end of the main body, a third enclosed cavity is enclosed by the fifth side wall and the sixth side wall, the printed circuit board is fixed into the third enclosed cavity, and the other end of the main body is attached on the array substrate.

Preferably, the at least one connector is fixed through one assembling slot disposed on the printed circuit board and two free ends of the connector extending out of the assembling slot are attached on the array substrate.

The present disclosure provides the liquid crystal display device and a liquid crystal display panel based on three-dimensional transistor thereof. The array substrate and the printed circuit board can be supported by the connectors effectively. The connectors share gravity of the printed circuit board with the first chip on film attached between the array substrate and the printed circuit board. Therefore, the present disclosure can avoid damage to the lines of the first chip on film and improve the yield rate of the quality of the liquid crystal display panel based on three-dimensional transistor.

DESCRIPTION OF THE DRAWINGS

Many aspects of the embodiments can be better understood with reference to the following drawings. The components in the drawings are not necessarily dawns to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment is this disclosure are not necessarily to the same embodiment, and such references mean at least one.

Figure 1:
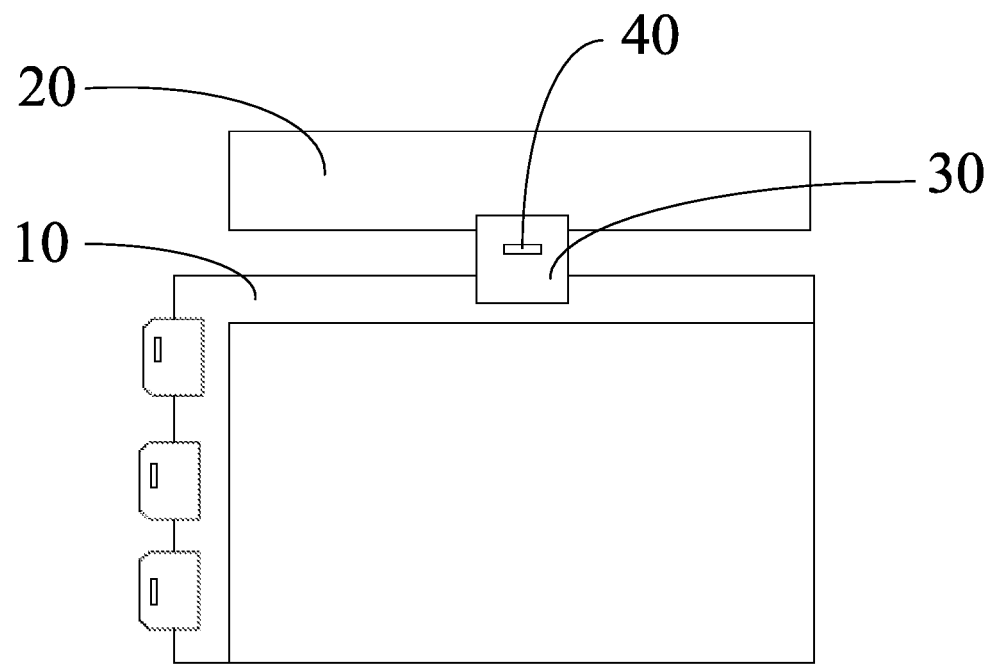
FIG. 1 is a schematic view of a present liquid crystal display panel based on three-dimensional transistor.
Figure 2:
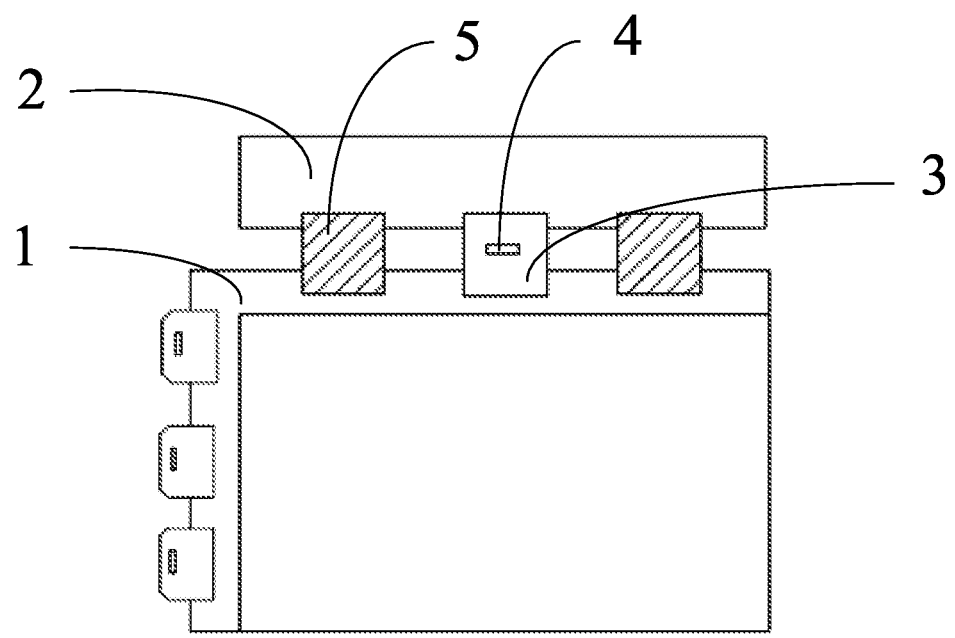
FIG. 2 is a schematic view of a liquid crystal display panel based on three-dimensional transistor in accordance with an embodiment of the present disclosure.

Referring to FIG. 2, a liquid crystal display panel based on three-dimensional transistor in accordance with an embodiment of the present disclosure is schematically shown. A liquid crystal display panel based on three-dimensional transistor of the present disclosure includes an array substrate 1, a printed circuit board 2, a first chip on film 3 with an integrated circuit 4, and two connectors 5. The first chip on film 3 is attached between the array substrate 1 and the printed circuit board 2. The connectors 5 are connected between the array substrate 1 and the printed circuit board 2 and for sharing gravity of the printed circuit board 2 with the first chip on film 3 attached between the array substrate 1 and the printed circuit board 2. Therefore, lines of the first chip on film 3 can be prevented from being damaged, which improves the yield rate of the quality of the liquid crystal display panel based on three-dimensional transistor.

In the liquid crystal display panel based on three-dimensional transistor provided in the embodiment of the present disclosure, the connectors 5 are disposed between the array substrate 1 and the printed circuit board 2 for supporting the array substrate 1 and the printed circuit board 2 and sharing gravity of the printed circuit board 2 with the first chip on film 3 attached between the array substrate 1 and the printed circuit board 2, which prevents the lines of the first chip on film 3 from being damaged and further improves the yield rate of the quality of the liquid crystal display panel based on three-dimensional transistor.

In a specific embodiment of the present disclosure, each connector 5 is a sheet which is made of copper laminate, aluminum foil laminate or PET (Polyethylene terephthalate). It can be understood that the connector 5 is not limited to be made of copper, aluminum or PET, also can be made of any other materials which are capable of supporting the array substrate 1 and the printed circuit board 2 and partially undertaking the gravity of the printed circuit board 2.

In another specific embodiment of the present disclosure, each the connector 5 is a second chip on film with a function circuit. The function circuit can be a simple circuit designed for improving the resolution of the display panel and further improving the performance of the display panel.

Figure 3:
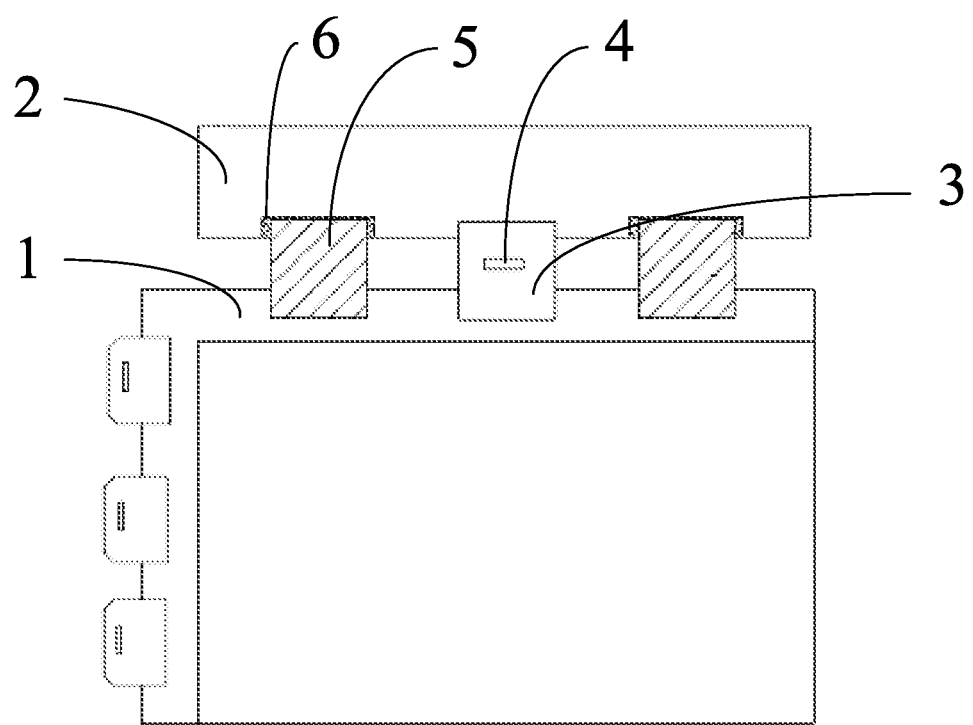
FIG. 3 is a schematic view showing that liquid crystal display panel based on three-dimensional transistor is applied to a specific embodiment.

Referring to FIG. 3, the liquid crystal panel applied in one specific embodiment is schematically shown. Each connector 5 in this embodiment of the present disclosure is a conductive plate used to guide static electricity of the array substrate 1 to the printed circuit board 2. One copper leakage area 6 connected to each conductive plate is disposed on the printed circuit board 2. The static electricity of the array substrate 1 is guided to the printed circuit board 2 through the conductive plate and is further guided to ground through the copper leakage area 6.

In one specific embodiment of the present disclosure, one of the connectors 5 is a second film on chip with a function circuit, the other one of the connectors 5 is a conductive plate for guiding the static electricity of the array substrate 1 to the printed circuit board 2, and a copper leakage area 6 is disposed on the printed circuit board 2 and is connected to the conductive plate. Therefore, the connectors 5 in this embodiment of the present disclosure not only can share the gravity of the printed circuit board 2 with the first chip on film 3, but also can guide the static electricity of the array substrate 1 to the printed circuit board 2 to allow the static electricity to be further guided to ground through the copper leakage area 6, thereby improving the performance of the display panel.

It can be understood that the number of the connectors 5 is not limited to two, and can be increased or decreased as needed.

When the connector 5 is a sheet made of copper laminate, aluminum foil laminate or PET, the connector 5 is bonded to the array substrate 1 and the printed circuit board 2 by double-sided foam tape. Preferably, when the connector 5 is a metal laminate such as a copper laminate, an aluminum foil laminate, the connector 5 is bonded to the array substrate 1 and the printed circuit board 2 by conductive double-sided foam tape.

When the connector 5 is the second chip on film with a function circuit, the connector 5 is bonded to the array substrate 1 and the printed circuit board 2 by heat seal.

It can be understood that the way that the connector 5 is connected to the array substrate 1 and the way that the connector 5 is connected to the printed circuit board 2 are not limited to the above embodiment. In one specific embodiment of the present disclosure, each connector 5 includes a main body; a first side wall and a second side wall extend from one end of the main body, and a third side wall and a fourth side wall extend from the other end of the main body. A first enclosed cavity is enclosed by the first side wall and the second side wall, and the printed circuit board 2 is fixed into the first enclosed cavity. A second enclosed cavity is enclosed by the third side wall and the fourth side wall, and the array substrate 1 is fixed into the second enclosed cavity. Since the printed circuit board 2 is fixed into the first enclosed cavity enclosed by the first side wall and the second side wall and the array substrate 1 is fixed into the second enclosed cavity enclosed by the third side wall and the fourth side wall, the reliabilities of the connection between the array substrate 1 and the connector 5 and the connection between the printed circuit board 2 and the connector 5 can be enhanced, which can further protect the lines on the first chip on film from damage.

In one specific embodiment of the present disclosure, the way that the connector 5 is connected to and the array substrate 1 and the way that the connector 5 is connected to the printed circuit board 2 may be as follow: the connector 5 includes a main body; a fifth side wall and a sixth side wall extend from one end of the main body; a third enclosed cavity is enclosed by the fifth side wall and the sixth side wall, and the printed circuit board 2 is fixed into the third enclosed cavity; and the other end of the main body is attached on the array substrate 1. Since the printed circuit board 2 is fixed into the first cavity enclosed by the first side wall and the second side wall, the reliability of the connection between the printed circuit board 2 and the connector 5 can be enhanced and the lines on the first chip on film can be protected from damage.

In an alternative embodiment of the present disclosure, the way that the connector 5 is connected to the array substrate 1 and the way that the connector 5 is connected to the printed circuit board 2 may also be as follow: the connector 5 is fixed through one assembling slot disposed on the printed circuit board 2 and two free ends of the connector 5 extending out of the assembling slot are attached on the array substrate 1.

An embodiment of the present disclosure further provides a liquid crystal display device which includes a display panel, wherein the display panel is similar to that of the liquid crystal display panel based on three-dimensional transistor of the embodiments shown in FIGS. 2 and 3. Since the liquid crystal display device in the embodiment of the present disclosure includes the liquid crystal display panel based on three-dimensional transistor mentioned above, it also has the same advantages as the liquid crystal display panel based on three-dimensional transistor mentioned above, for example, the liquid crystal display device can avoid damage to the lines of the first chip on film, improve the performance and the yield rate of the quality of the liquid crystal display device, and prolong the life of the liquid crystal display device.

Even though information and the advantages of the present embodiments have been set forth in the foregoing description, together with details of the mechanisms and functions of the present embodiments, the disclosure is illustrative only; and that changes may be made in detail, especially in matters of shape, size, and arrangement of parts within the principles of the present embodiments to the full extend indicated by the broad general meaning of the terms in which the appended claims are expressed.

What is claimed is:

1. A liquid crystal display panel based on three-dimensional transistor, comprising:
    an array substrate;
    a printed circuit board; and
    a first chip on film with an integrated circuit, the first chip on film being attached between the array substrate and the printed circuit board; and
    at least one connector connected between the array substrate and the printed circuit board.

2. The liquid crystal display panel as claimed in claim 1, wherein the at least one connector is a sheet made of copper laminate, aluminum foil laminate or PET.

3. The liquid crystal display panel as claimed in claim 1, wherein the at least one connector is a second chip on film with a function circuit mounted thereon.

4. The liquid crystal display panel as claimed in claim 1, wherein each of the at least one connector is a conductive plate used to guide static electricity of the array substrate to the printed circuit board, and at least one copper leakage area is disposed on the printed circuit board and is respectively connected to the corresponding conductive plate.

5. The liquid crystal display panel as claimed in claim 4, wherein the at least one connector is bonded to the array substrate and the printed circuit board.

6. The liquid crystal display panel as claimed in claim 1, wherein the number of the connector is at least two, at least one of the connector is a second chip on film with a function circuit and at least one of the connector is a conductive plate used to guide static electricity of the array substrate to the printed circuit board, and at least one copper leakage area is disposed on the printed circuit board and is respectively connected to the conductive plate.

7. The liquid crystal display panel as claimed in claim 1, wherein the at least one connector comprises a main body; a first side wall and a second side wall extend from one end of the main body, and a third side wall and a fourth side wall extend from the other end of the main body; a first enclosed cavity is enclosed by the first side wall and the second side wall, and the printed circuit board is fixed into the first enclosed cavity; a second enclosed cavity is enclosed by the third side wall and the fourth side wall, and the array substrate is fixed into the second enclosed cavity.

8. The liquid crystal display panel as claimed in claim 1, wherein the at least one connector comprises a main body; a fifth side wall and a sixth side wall extend from one end of the main body, a third enclosed cavity is enclosed by the fifth side wall and the sixth side wall, the printed circuit board is fixed into the third enclosed cavity, and the other end of the main body is attached on the array substrate.

9. A liquid crystal display panel based on three-dimensional transistor, comprising:
    an array substrate;
    a printed circuit board; and
    a first chip on film with an integrated circuit, the first chip on film being attached between the array substrate and the printed circuit board; and
    at least one connector connected between the array substrate and the printed circuit board, the at least one connector being fixed through one assembling slot disposed on the printed circuit board and two free ends of the connector extending out of the assembling slot being attached on the array substrate.

10. The liquid crystal display panel as claimed in claim 9, wherein the at least one connector is a sheet made of copper laminate, aluminum foil laminate or PET, or the at least one connector is a second chip on film with a function circuit, or the at least one connector is a conductive plate used to guide static electricity of the array substrate to the printed circuit board, and at least one copper leakage area is disposed on the printed circuit board and is respectively connected to the conductive plate.

11. The liquid crystal display panel as claimed in claim 9, wherein the number of the connector is at least two, at least one of the connector is a second chip on film with a function circuit and at least one of the connector is a conductive plate used to guide static electricity of the array substrate to the printed circuit board, and at least one copper leakage area is disposed on the printed circuit board and is respectively connected to the conductive plate.

12. A liquid crystal display device, comprising: a liquid crystal display panel based on three-dimensional transistor, and the liquid crystal display panel comprising:
   an array substrate;
   a printed circuit board; and
   a first chip on film having an integrated circuit, the first chip on film being attached between the array substrate and the printed circuit board; and
   at least one connector being connected between the array substrate and the printed circuit board.

13. The liquid crystal display device as claimed in claim 12, wherein the at least one connector is a sheet made of copper laminate, aluminum foil laminate or PET.

14. The liquid crystal display device as claimed in claim 12, wherein the at least one connector is a second chip on film with a function circuit.

15. The liquid crystal display device as claimed in claim 12, wherein the at least one connector is a conductive plate used to guide static electricity of the array substrate to the printed circuit board, and at least one copper leakage area is disposed on the printed circuit board and is respectively connected to the conductive plate.

16. The liquid crystal display device as claimed in claim 15, wherein the at least one connector is bonded to the array substrate and the printed circuit board.

17. The liquid crystal display device as claimed in claim 12, wherein the number of the connector is at least two, at least one of the connector is a second chip on film with a function circuit and at least one of the connector is a conductive plate used to guide static electricity of the array substrate to the printed circuit board, and at least one copper leakage area is disposed on the printed circuit board and is respectively connected to the conductive plate.

18. The liquid crystal display device as claimed in claim 12, wherein the at least one connector comprises a main body; a first side wall and a second side wall extend from one end of the main body, and a third side wall and a fourth side wall extend from the other end of the main body; a first enclosed cavity is enclosed by the first side wall and the second side wall, and the printed circuit board is fixed into the first enclosed cavity; a second enclosed cavity is enclosed by the third side wall and the fourth side wall, and the array substrate is fixed into the second enclosed cavity.

19. The liquid crystal display device as claimed in claim 12, wherein the at least one connector comprises a main body; a fifth side wall and a sixth side wall extend from one end of the main body, a third enclosed cavity is enclosed by the fifth side wall and the sixth side wall, the printed circuit board is fixed into the third enclosed cavity, and the other end of the main body is attached on the array substrate.

20. The liquid crystal display device as claimed in claim 12, wherein the at least one connector is fixed through one assembling slot disposed on the printed circuit board and two free ends of the connector extending out of the assembling slot are attached on the array substrate.

* * * * *